United States Patent
O'Regan et al.

(10) Patent No.: US 11,181,567 B2
(45) Date of Patent: Nov. 23, 2021

(54) APPARATUS FOR ISOLATING HIGH IMPEDANCE FAULT IN MULTI-TAP ELECTRICAL POWER DISTRIBUTION SYSTEM

(71) Applicant: ELECTRICAL MATERIALS COMPANY, Genoa City, WI (US)

(72) Inventors: Timothy M O'Regan, Chicago, IL (US); Timothy J O'Regan, Park Ridge, IL (US)

(73) Assignee: Electrical Materials Company, Genoa City, WI (US)

(*) Notice: Subject to any disclaimer, the term of this patent is extended or adjusted under 35 U.S.C. 154(b) by 215 days.

(21) Appl. No.: 16/362,117

(22) Filed: Mar. 22, 2019

(65) Prior Publication Data

US 2020/0300905 A1 Sep. 24, 2020

(51) Int. Cl.
| | |
|---|---|
| *H02H 3/00* | (2006.01) |
| *G01R 31/08* | (2020.01) |
| *H02H 3/04* | (2006.01) |
| *G01R 31/28* | (2006.01) |

(52) U.S. Cl.
CPC ......... *G01R 31/08* (2013.01); *G01R 31/2836* (2013.01); *H02H 3/042* (2013.01)

(58) Field of Classification Search
CPC ..... G01R 31/08; G01R 31/3126; H02H 3/042
USPC ............................................. 324/512; 361/88
See application file for complete search history.

(56) References Cited

U.S. PATENT DOCUMENTS

| | | | |
|---|---|---|---|
| 5,498,954 A | 3/1996 | Bassett et al. | |
| 6,292,340 B1 | 9/2001 | O'Regan et al. | |
| 6,852,939 B2 | 2/2005 | Rhein et al. | |
| 7,656,640 B2 | 2/2010 | Domejean et al. | |
| 9,136,692 B2 | 9/2015 | O'Regan et al. | |
| 9,373,952 B2 | 6/2016 | O'Regan et al. | |
| 9,385,522 B2 | 7/2016 | O'Regan et al. | |

(Continued)

OTHER PUBLICATIONS

ISR issued in Int'l. Application No. PCT/US20/23874, dated Jun. 17, 2020.

*Primary Examiner* — Jared Fureman
*Assistant Examiner* — Lucy M Thomas
(74) *Attorney, Agent, or Firm* — Hinshaw & Culbertson LLP

(57) ABSTRACT

Apparatus detects an electrical fault in a primary tap having a plurality of distribution transformers each provided in a distribution circuit along a length of the primary tap, on a power distribution system. The apparatus includes a voltage monitor provided at each of the distribution circuits for monitoring a voltage in a corresponding distribution circuit, a controller in communication with each of the voltage monitor for receiving the voltage monitored and transmitted by the voltage monitors, and a fuse isolator configured to electrically connect the primary tap to a high voltage on the power distribution system and electrically disconnect the primary tap from the high voltage on power distribution system when activate. A fuse isolator actuator in communication with the controller is provided for activating the fuse isolator responsive to a control signal from the controller when a fault in the primary tap is detected by the controller, which determines that a fault exists in the primary tap based on the voltages monitored by the plurality of voltage monitors.

11 Claims, 6 Drawing Sheets

(56) References Cited

U.S. PATENT DOCUMENTS

2018/0198247 A1* 7/2018 Klein .................. H02B 1/26
2018/0233895 A1   8/2018 O'Regan et al.

* cited by examiner

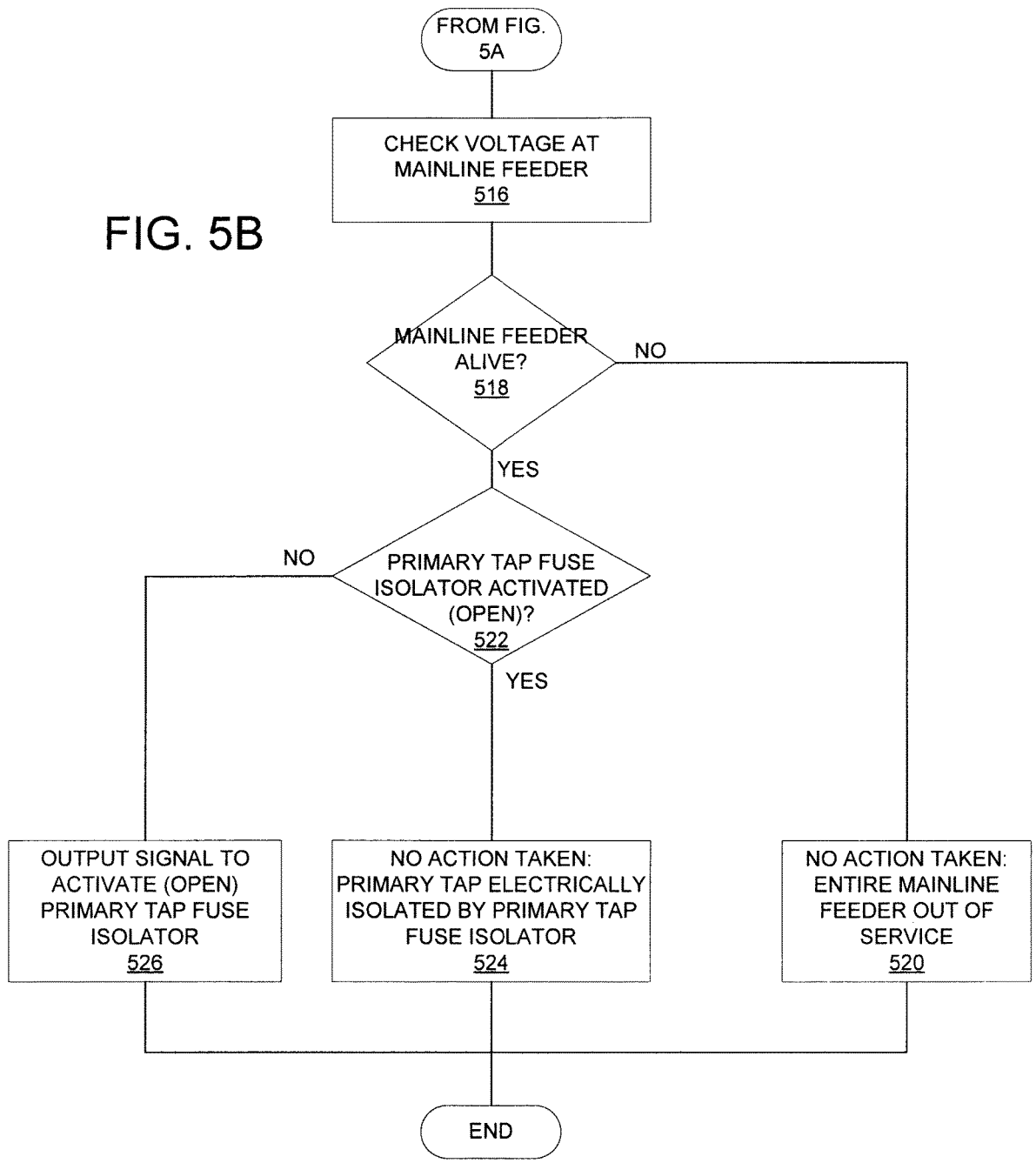

APPARATUS FOR ISOLATING HIGH IMPEDANCE FAULT IN MULTI-TAP ELECTRICAL POWER DISTRIBUTION SYSTEM

BACKGROUND OF THE INVENTION

Field of Invention

This invention relates generally to apparatus for isolating a downed alternating current electric utility primary distribution circuit conductor, and more particularly, to an electrical safety system capable of detecting, processing and isolating a high impedance, low fault current disposed in a remote branch or tap of an electrical power distribution network or elsewhere the earth medium is a high impedance material.

Description of Related Art

A downed alternating current (AC) electric utility primary distribution circuit conductor which has developed into a high impedance fault, which overcurrent protection devices or high impedance detection systems have been unable to clear, is a dangerous condition. This condition may occur at any location on an electrical utility distribution circuit due to lack of conductivity of the earth in the fault current return path. In some instances, the line impedance due to the distance of the ground fault from a substation source combined with high fault impedance at the wire down location, may limit the ground fault current to a value less than the normal actual load current at this location.

The frequent occurrence of live downed high voltage primary tap is directly related to the high incidence of variable high impedance ground fault return paths. This variable ground fault impedance is directly related to the various withstand voltages of a wide range of values of impedances in the variable grounding material. The withstand voltage, measured in volts per mm, across the material under stress, may vary over a period of time as high voltage is maintained at the fault by the downed wire. This variation in the material withstand voltage is dependent upon both material type and moisture content. A breakdown by the line to ground fault voltage of the earth material into carbon paths, which are leakage fault current seeking return paths to the power source, is an impedance regression which occurs until the high impedance ground resistance collapses and the full available fault current occurs. Carbon paths may develop, either directly through the material or in a circuitous exterior path. A poorly developed carbon path may also result in re-establishing a high impedance fault because the downed conductor can move (dance) as the fault current begins to flow, landing on another highly non-conducive medium, permitting the downed high voltage live wire condition to again persist with a high impedance to ground.

High impedance, low current faults, such as a downed distribution line conductor in an electric utility distribution network which is contacting a poor conductive earth composition, have proven to be difficult to isolate with present technology. Conventional overcurrent protection devices, both at the source and at strategic circuit locations, use the combined relationship of fault current magnitude and time duration to clear faults associated with downed grounded high voltage conductors. These protection devices function to locally isolate faulted circuit portions in the smallest segments possible in order to maintain normal service to the balance of customers served on that same circuit. These downstream overcurrent protection devices are designed to be time coordinated with each other and with the main circuit breaker in order to automatically isolate dangerous conditions located throughout the distribution circuit. Standard overcurrent protection devices with time related fault current clearing curves encounter particularly difficult situations for detecting a high impedance fault in an electrical distribution system which involve a live conductor downed, but intact, and grounded through a poor conducting medium such as sand, rock, concrete, snow, blacktop or a tree. The variable ground fault impedance may approach infinity with an equivalent fault current value of zero amps.

For reliability purposes, it is common electric utility practice to install downstream circuit reclosers, expulsion fuses or sectionalizers at all taps to the main stem distribution circuit. Present applied overcurrent protection devices are, however, unable to distinguish low fault currents (high impedance faults) from normal load currents because trip settings for these devices are typically set at 125 to 250% of maximum estimated peak load current. These standard tripping current levels are selected to minimize inadvertent tripping due to transient causes. Isolating devices with more sensitive protection have recently been introduced, but still require a certain minimum value of fault current and have no automated means of clearing for a zero or near zero current flow. A hazardous condition for the public is created when energized high voltage conductors fall to the ground or come in contact with a high impedance fault current return path, and the overcurrent protection system fails to de-energize the conductor. Physical contact with an energized distribution primary conductor by any conducting body may cause serious injury or death due to electric shock. Numerous fatalities and serious injuries occur annually in the United States due to inadvertent contact with live downed power distribution conductors. Experience has shown that these conditions occur more frequently at distribution level voltages of 15 KV and below, which is the predominant primary distribution voltage range in the United States.

Referring to FIG. 1, a simplified schematic diagram of a prior art high impedance fault sensing arrangement is shown. An overhead distribution primary circuit 10 extends from a substation bus 28 along with a number of other overhead distribution primary circuits 32a, 32b. The substation bus 28 is energized by a substation step down transformer 36, which is connected to the substation bus 28 via a substation bus transformer breaker 34.

The overhead distribution primary circuit 10 includes a low impedance detection arrangement 20 coupled to a primary tap 38 by means of a transducer 22. The impedance detection arrangement 20 receives signals generated in the primary tap 38 through the transducer 22. These signals are conditioned and compared by a microprocessor 24 with a stored signal pattern which is characteristic of normal system operation. Another microcomputer 26 coupled to the microprocessor 24, as well as to the main overcurrent relay-circuit breaker combination 18, makes a trip/output decision based upon several operating parameters which are weighted. The primary tap 38 typically includes one or more branch taps 16 having multiple distribution transformers 30a, 30b and 30c. A fuse cutout or circuit recloser 14 is typically provided on each branch tap 16 for detecting high voltage faults in the branch tap 16, and the main overcurrent relay-circuit breaker combination 18 is provided on the primary tap 38 for detecting high voltage faults in the primary tap 38.

While the arrangement shown in FIG. 1 is designed for detection and shutdown of high voltage (low impedance)

faults involving large currents, it is incapable of detecting and isolating high voltage ground faults accompanied by minimal ground fault currents, such as when the branch tap 16 experiences a broken or downed conductor 29 and the downed live high voltage wire is sitting on the ground (see electrical circuit representation 12 in FIG. 1).

Accordingly, a low fault current isolator system is needed to permit electrical utilities to detect a high impedance fault characterized by a zero or near zero value ground fault current. This low fault current isolating system is needed to minimize the time period that a downed wire remains alive, after an overcurrent protection fault isolation device has failed to de-energize the downed live high voltage wire.

BRIEF SUMMARY OF THE INVENTION

Accordingly, it is an object of the present invention to minimize out of service (o/s) signal data processing time and safely detect, isolate and de-energize an AC electric utility primary distribution circuit conductor in a multi-tap, or multi-branch, electric power distribution network using only the circuit protection on the effected tap, or branch, leaving the balance of the circuit in service.

In accordance with one embodiment, the present invention is directed to apparatus for detecting an electrical fault in a primary tap having a plurality of distribution transformers each provided in a distribution circuit along a length of the primary tap, on a power distribution system. The apparatus includes a voltage monitor provided at each of the distribution circuits for monitoring a voltage in a corresponding distribution circuits, a controller in communication with each of the voltage monitors for receiving the voltage monitored and transmitted by the voltage monitors, and a fuse isolator configured to electrically connect the primary tap to the power distribution system and electrically disconnect the primary tap from the power distribution system when activated. A fuse isolator actuator in communication with the controller is provided for activating the fuse isolator responsive to a control signal from the controller when a fault in the primary tap is detected by the controller, which determines that the fault exists in the primary tap based on the voltages monitored by the plurality of voltage monitors.

In accordance with another embodiment, the present invention is directed to a method for detecting an electrical fault in a primary tap on a power distribution system. The primary tap has a plurality of serially coupled combination circuits provided along its length and a fuse isolator configured to electrically connect the primary tap to the power distribution system and electrically disconnect the primary tap from the power distribution system when activated. The method includes monitoring, by each of voltage monitors in the plurality of serially coupled combination circuits, a voltage in the corresponding plurality of serially coupled combination circuits; receiving, by the processor, the voltage monitored and transmitted by the voltage monitors; and determining, by the processor, that a fault exists in the primary tap based on the voltages monitored by the plurality of voltage monitors. The processor outputs a control signal to a fuse isolator actuator in communication with the processor for activating the fuse isolator when a fault in the primary tap is detected by the processor.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIGS. 5A and 5B are flowcharts illustrating the operation of the controller included in the HIFIS during detection, localization and de-energization of a high impedance, low current fault in a primary tap of an electrical power distribution system in accordance with one embodiment of the present invention.

DETAILED DESCRIPTION OF THE INVENTION

Figure 2:
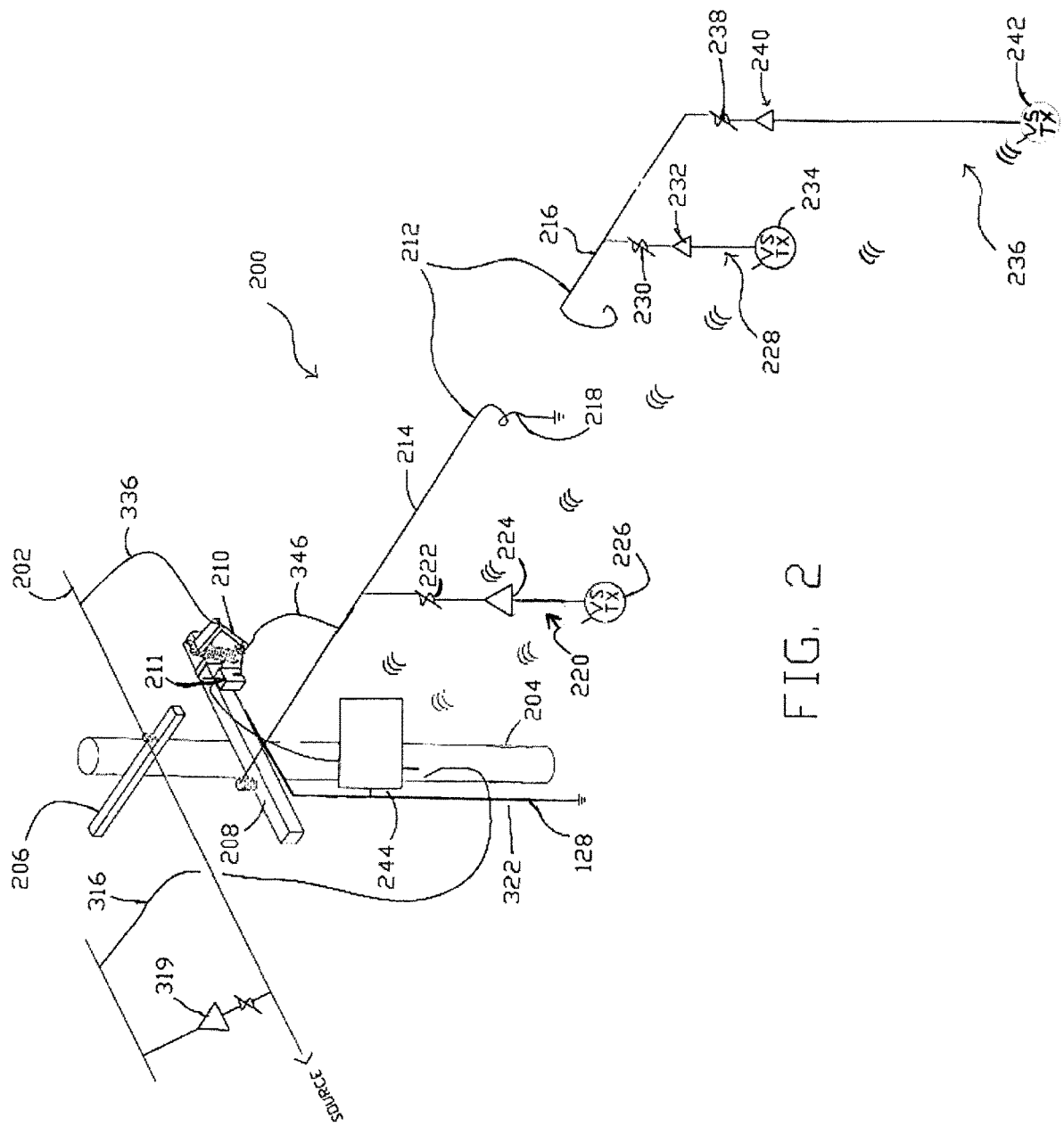
FIG. 2 is a simplified schematic diagram illustrating details of a high impedance, low fault current downed wire detection, isolation and de-energization system in accordance with the principles of the present invention.

Referring now to FIG. 2, a single phase utility overhead distribution circuit tap 200 adapted to clear a downed live wire is shown in accordance with one embodiment of the present invention. The distribution circuit tap 200 includes a mainline feeder 202 carrying electrical energy from a power source (not shown). The mainline feeder 202 is coupled to and supported by an electric pole 204 having an attached a first cross member 206. Also secured to the electric pole 204 is a second cross member 208 to which a primary tap fuse isolator 210 and a fuse isolator actuator 211 are attached. The fuse isolator 210 is electrically connected to the mainline feeder 202 and a primary tap 212 and, upon being activated by the fuse isolator actuator 211, operates to electrically isolate the primary tap 212 from the mainline feeder 202 in the event of a fault in the primary tap 212.

In FIG. 2, a scenario is depicted, as an example, in which the primary tap 212 has a high impedance fault 218 located between a troubled primary tap 214 and a broken primary tap 216. The troubled primary tap 214 represents a portion of the primary tap 212 that is still electrically alive, and the broken primary tap 216 at the distal end of the primary tap 212 represents a portion of the primary tap 212 which is electrically dead and no longer carries electric current sourced by the primary tap 212.

Attached to the troubled primary tap 214 is a first serially coupled combination circuit 220 including a first fuse 222, a first distribution transformer 224 and a first voltage monitor (VSTX) 226, with the first fuse 222 being connected directly to the troubled primary tap 214. Similarly, a second serially coupled combination circuit 228 including a second fuse 230, a second distribution transformer 232 and a second voltage monitor (VSTX) 234 is attached to the broken primary tap 216, with the second fuse 230 being connected to directly to the broken primary tap 216. Also attached to the broken primary tap 216 is a third serially coupled combination circuit 236 in parallel with the second serially coupled combination circuit 228. The third serially coupled combination circuit 236 includes a third fuse 238, a third distribution transformer 240 and a third voltage monitor (VSTX) 242, with the third fuse 238 being connected directly to the broken primary tap 216. It should be understood that the number of serially coupled combination circuits 220, 228, 236 shown in the FIG. 2 is only an example, and that there may be fewer or more serially coupled combination circuits connected to either the troubled primary tap 214 and/or the broken primary tap 216.

The first, second and third fuses 222, 230, 238, are expulsion type fuses for protecting individual distribution transformers. The first, second and third distribution transformers 224, 232, 240, may be two winding step down transformers providing 120 utilization AC voltage. The first, second and third voltage monitors 226, 234, 242 constantly monitor the voltage in their respective combination circuits 220, 228, 236, and are configured to transmit the monitored voltage to a control box 244. The first, second and third serially coupled combination circuits 220, 228 and 236 provide the step down voltage from the distribution transformers 224, 232, 240 to their respective final destination.

The control box 244 is attached to the electric pole 204 near, and in communication with, the fuse isolator actuator 211. A controller 308 (shown in FIG. 3) is housed in the control box 244 and operates to control the fuse isolator actuator 211, which in turn activates the primary tap fuse isolator 210 to electrically isolate the primary tap 214 from the mainline feeder 202 in the event of a high impedance, low current fault in the primary tap. In addition to the electric pole 204, the control box 244 may be provided at other locations, such as on the second cross member 208, proximate the primary tap fuse isolator 210. The fuse isolator actuator 211 is provided in a housing 246 (see FIGS. 3 and 4), and as with the control box 244 should be rugged and waterproof as to protect the components housed within from the environment. In one embodiment, the control box 244 and the housing 246 are both made from a weather proof plastic material, such as injection molded polypropylene, sized to contain the components.

Figure 3:
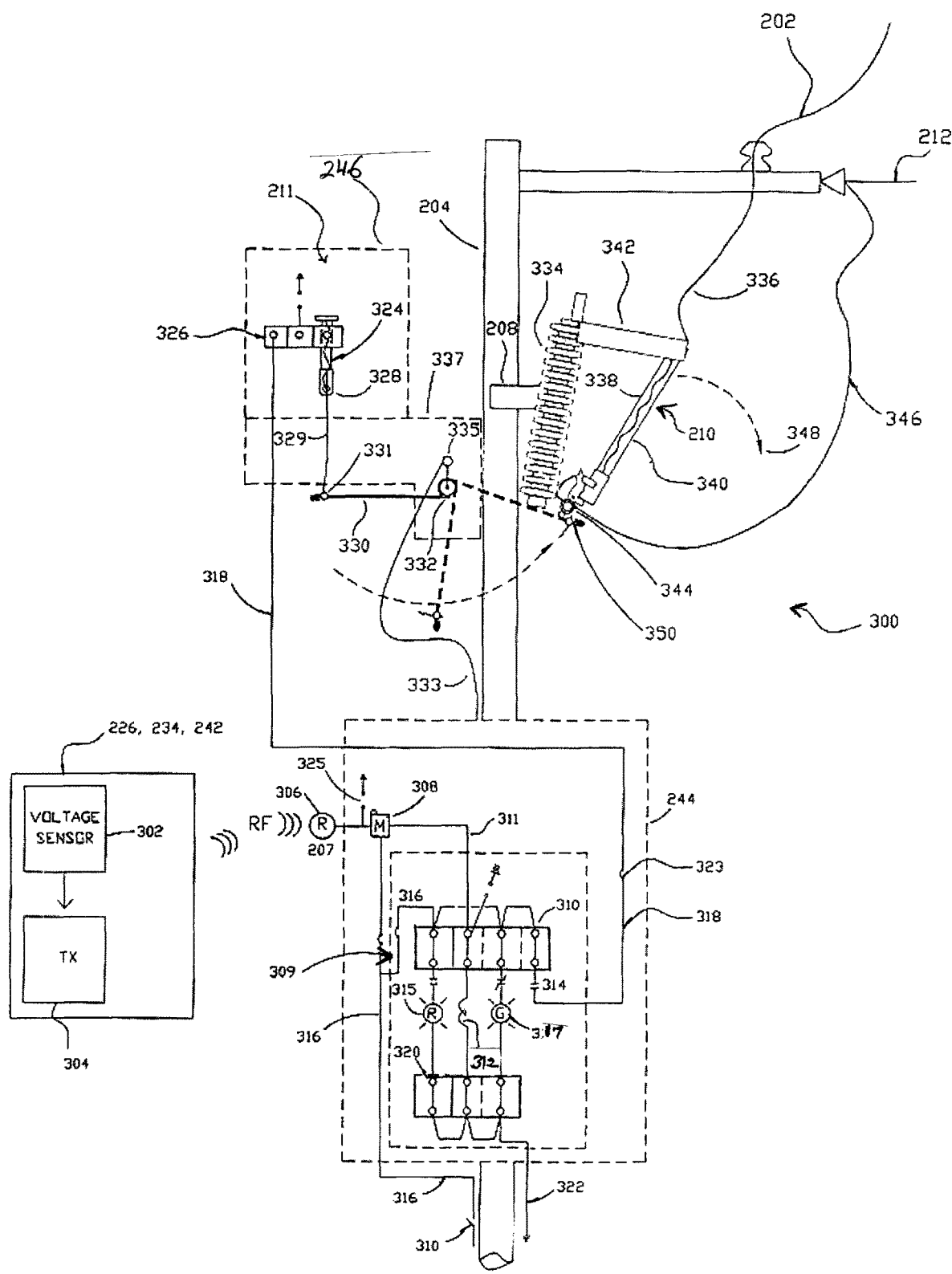
FIG. 3 is a simplified schematic and block diagram illustrating a high impedance fault isolation system (HIFIS) for safely grounding a faulted primary tap in accordance with one embodiment of the present invention.

Turning now to FIG. 3, and in accordance with one embodiment of the present invention, the first, second and third voltage monitors 226, 234, 242, the control box 244, the fuse isolator actuator 211, and the primary tap fuse isolator 210 comprise a high impedance fault isolation system (HIFIS) 300. The HIFIS 300 is adapted to both identify and isolate high impedance, low current faults which frequently occur when the downed primary tap 16 remains alive, e.g., the scenario shown in FIG. 2 where the high impedance fault 218 occurs in the primary tap 212. This dangerous condition may have zero fault current, due to very high variable earth impedance between the downed live conductor (e.g., the troubled primary tap 214) and the earth current return path. In FIG. 2, the HIFIS 300 is shown to be employed in the single phase utility overhead distribution circuit tap 200 in which the mainline feeder 202 may provide 15000 VAC to the primary tap 212. However, the HIFIS 300 is not limited for use in a 15000 VAC system and may be employed in distribution circuit taps with higher or lower AC voltage, for example, circuit taps having AC voltage from 4000 to 25000 VAC.

The first, second and third voltage monitors 226, 234, 242 each includes a voltage sensor 302 and an RF transmitter 304. The voltage sensor 302 is electrically connected to the transformer in the corresponding serially coupled combination circuit (i.e., distribution transformers 224, 232, 240 in the serially coupled combination circuits 220, 228, 236 shown in FIG. 2), and continuously senses the voltage in its corresponding serially coupled combination circuit. In one embodiment, the voltage sensor 302 may be a 120-volt solid state sensing relay with a dropout range of approximately 30% or more. The voltage detected by the voltage sensor 302 is converted from coded digital signal to analog AC signal using pulse width modulation by the RF transmitter 304 and transmitted to the control box 244. In one embodiment, the RF transmitter 304 is a ZIGBEE RF module per IEEE 802.15, and includes a backup capacitive power supply.

The control box 244 includes an RF receiver 306 with an antenna, which polls the incoming analog AC signals to monitor the first, second and third voltage monitors (VSTX's) 226, 234, 242 in the serially coupled combination circuits 220, 228, 236 on the primary tap 212. The RF receiver 306 converts the AC signal to digital signal and sends the digital signal to the controller 308 such as a processor or a microprocessor having an IEEE STANDARD 805.14.4 compliant chip. Control signals output by the controller 308 is transmitted to a relay 309 via a conductor 311. The relay 309 is of a type that includes a 120 VAC coil with two normally open contacts and one normally closed contact. A control signal from the controller 308 energizes a relay coil 312 in the relay 309 through a terminal block 310. A relay contact 314 operated by the relay coil 312 is also connected to the terminal block 310 and is electrically connected on one side to a 120 VAC source line 316 and the other side to a 120 VAC control power line 318 which is connected at the opposite end to the fuse isolator actuator 211. When closed, the relay contact 314 provides the voltage to the control power line 318. As shown in FIGS. 2 and 3, the voltage source line 316 originates from a mainline distribution transformer 319 connected to the mainline feeder 202, providing the 120 VAC control power for the controller 308 and the relay 309, which operates to provide 120 VAC to the fuse isolator actuator 211. The relay 309 may further include a pilot light 315 (e.g., red) as a visual indicator indicating that the HIFIS 300 has operated to de-energize the primary tap 212 in response to a high impedance low current fault condition existing in the primary tap. Another pilot light 317 (e.g., green) is also provided in the relay 309 to indicate that the HIFIS 300 is functional and monitoring the primary tap 212 for a potential high impedance low current fault condition.

The opposite side of the relay coil 312 connected to the control power line 316 is also electrically connected to a ground connection line 322 at a terminal block 320. The ground connection line 322 at the opposite end from the terminal block 320 is connected to ground near the base of the electric pole 204 through various known methods such as a ground rod having a resistance of 5 ohms or less. The ground connection line 322 grounds the relay coil 312 and the red and green pilot lights 315, 317.

The control box 244 also includes a circuit breaker 323 inserted in the control power line 318 to provide overcurrent protection, and a surge protector 325 for providing lightning overvoltage surge protection for the controller 308. A disconnect switch 321 in the voltage source line 316 is provided as a safety disconnect, operated by the serviceman when restoring or maintaining the HIFIS 300.

The fuse isolator actuator 211 is provided in a weather proofed housing 246, and includes a high voltage fuse link 324, which at one end is electrically connected to the control power line 318 through a bare plated aluminum bus bar 326, and at opposite fuse tail end 328 to a spring arm 330 with a connector 331. The spring arm 330 extends from a grounded spring 332 and is held by a spring retainer 329 and the connector 331 to place the grounding spring in tension or in a loaded position (shown in solid line). The grounded spring 332 is electrically connected to a grounding line 333 and is configured to be under tension in the loaded or hold position and, when the spring arm 330 is released by the fuse link 324, swings away from the loaded position to an activated position (shown in dotted line) to make contact with and apply ground to the primary tap fuse isolator 210. The grounding line 333 extends outside the housing 246 of the fuse isolator actuator 211 and may be connected to the ground connection line 322, so that they may be connected together to ground (5 ohms or less) near the base of the electric pole 204.

In one embodiment, the spring retainer 329 may be a combined alloy coated flexible wire made preferably of copper and connected at one end to a 15 k fuse element provided inside the 15 k fuse link barrel of the fuse link 324, and at the other end to the spring arm 330. The spring retainer 329 is fixedly connected to the spring arm 330 by the connector 331, which may be a split bolt connector arrangement provided near the distal end of the spring arm 330. However, any known arrangement for connecting a wire with a stiff metal arm may be employed. At the opposite end, the spring retainer 329 is swedged to the fuse tail end 328 of the fuse link 324.

The grounded spring 332, in one embodiment, is formed from phosphor bronze and approximately 0.160 inch in diameter. It is torsion wound and clamped at its base end 335 with the grounding line 333 to a plastic support 337 attached to pole 204. Attachment of the system ground to the base 335 of the grounded spring 332 insures the lowest impedance fault current return path when the spring arm 330 contacts the primary tap fuse isolator 210. The grounded spring 332 is left hand wound with an arm that is approximately 7.5 inches, and has a spring index that equals approximately 6.25 with 6 turns wound with 1-inch diameter. Preferably, the grounded spring 332 should be able to withstand tests of a symmetrical fault current of 10,000 amps @ 12000 volts for 3 cycles, so that the current magnitude and clearing time match the rating of the associated high voltage expulsion cutout. The spring arm 330 is applied in a permanent load position and released by the fuse link 324 which holds the spring arm 330 in torsion. Melting of the fuse element in the fuse link 324 after 120 VAC is applied releases the spring arm 330 to apply a low impedance ground fault to the primary tap fuse isolator 210.

Referring still to FIG. 3, the primary tap fuse isolator 210 includes a generally linear, elongated cutout insulator 334, preferably made of porcelain. The cutout insulator 334 provides insulation for interruption of high voltage source conductor 336 connected to the mainline feeder 202. The primary tap fuse isolator 210 also includes a conductive fuse element 338 provided within a tubular expulsion cutout 340. The top end of the expulsion cutout 340 is detachably coupled to the distal end of a coupling bracket 342, which is fixedly attached to the top end of the cutout insulator 334. The bottom end of the expulsion cutout 340 is pivotally coupled to a lower end portion of the cutout insulator 334 by means of a hinge 344. In addition to the conductive fuse element 338, the expulsion cutout tube 340 also contains an arc quenching powder material, such as boric acid, for extinguishing the conductive fuse element 338 after a high impedance fault. The conductive fuse element 338 is preferably comprised of silver and clears the fault by drawing the arc through the expulsion cutout 340. The quenching material is adapted to dissipate the arc within the expulsion cutout 340.

During normal operation when no fault exists in the primary tap 212, the conductive fuse element 338 is electrically connected to the high voltage source conductor 336 at the coupling bracket 342 and, at the opposite end, to the hinge 344, which is electrically connected to a high voltage tap conductor 346. The high voltage tap conductor 346 is electrically connected to the primary tap 212. The expulsion cutout 340 is configured to move between a generally upright position (normal operation), where its upper end engages the coupling bracket 342, and to a lowered position (not shown) when activated, where the upper end disengages from the coupling bracket 342 and falls away in a path shown by the dotted arrow 348.

In operation, the controller 308 in the control box 244 polls the incoming voltage signals from each of the voltage monitors 226, 234, 242 through the RF receiver 306. When the controller 308 determines that a fault has occurred (described in detail below) (FIG. 2 illustrates that a fault has occurred between the first serially coupled combination circuit 220 and the second serially coupled combination circuit 228, as an example), it energizes the relay coil 312 to close the contact 314. The closed contact 314 electrically connects the 120 AC voltage from the mainline distribution transformer 319 (shown in FIG. 2), through the voltage source line 316, with the fused link 324 in the fuse isolator actuator 211. In this manner, 120 AC voltage is applied to the fused link 324, melting the fuse element in the fused link 324 and releasing the spring arm 330 of the grounded spring 332 from the loaded position (shown in solid line) to the activated position (shown in dotted line). Released from the loaded position, the spring arm 330 comes in contact with the hinge 344 of the primary tap fuse isolator 211, which is electrically connected to the conductive fuse element 338 provided within the fused expulsion cutout 340 to activate the primary tap fuse isolator 210.

In the activated state, the grounded spring 332 directly and electrically connects the conductive fuse element 338 with the grounding line 333, which overloads and melts the conductive fuse element 338 within the fused expulsion cutout 340. This releases the fused expulsion cutout 340 from the coupling bracket 342 and allows it to pivot about the hinge 344 and fall under the influence of gravity in the direction of arrow shown by the dotted arrow 348. In this manner, the electrical connection between the high voltage source conductor 336 and the high voltage tap conductor 346, which is connected to the troubled primary tap 214, is completely broken, thereby de-energizing of the troubled primary tap.

Figure 4:
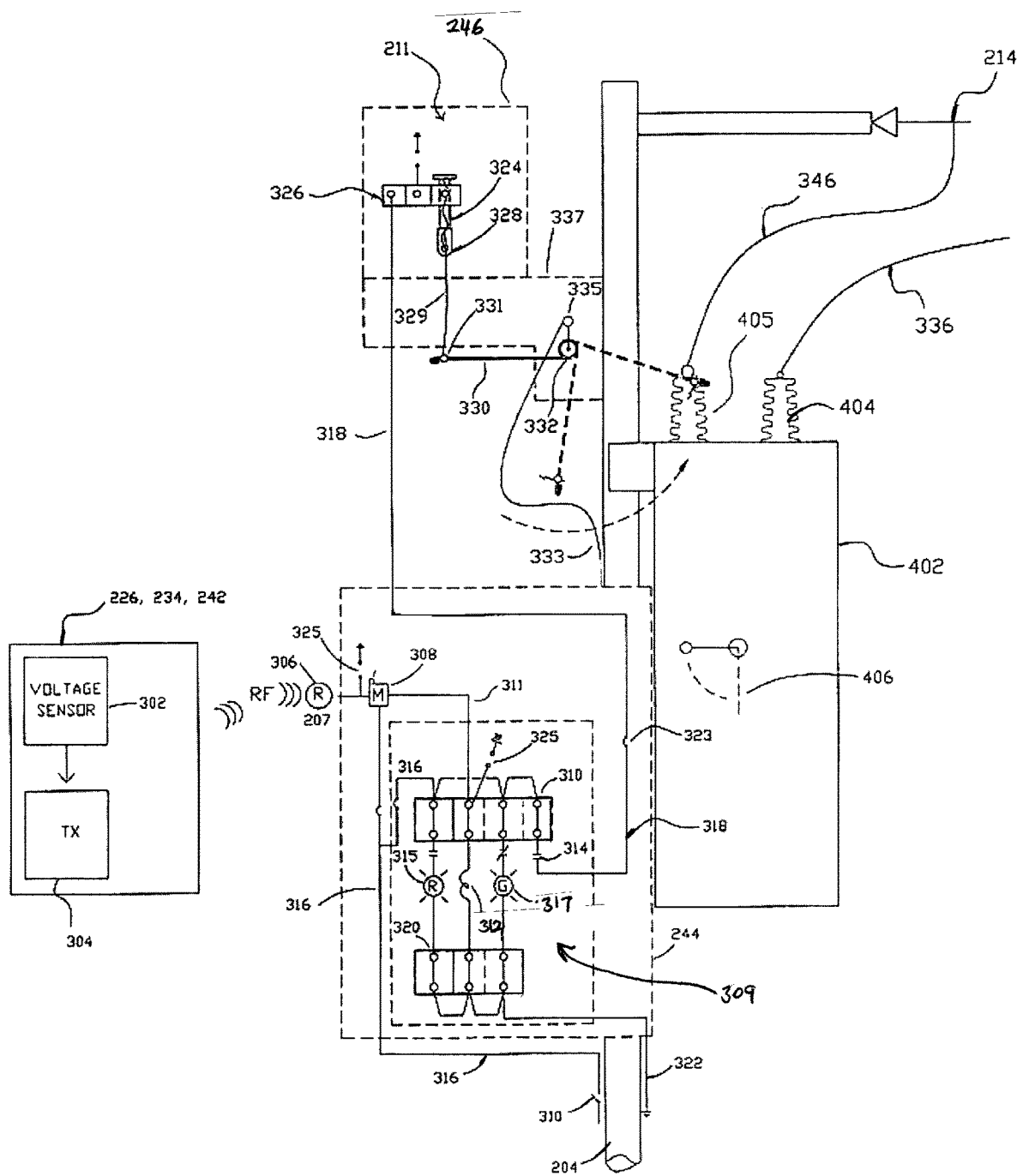
FIG. 4 is a simplified schematic diagram illustrating the operation of a recloser included in the HIFIS for safely grounding a faulted primary tap in accordance with another embodiment of the present invention.

Turning now to FIG. 4 and in accordance with another embodiment of the present invention, a recloser 402 is used to electrically isolate the troubled primary tap 214 from the mainline feeder 336 during a high impedance fault condition, similar to the primary tap fuse isolator 210 described above. The recloser 402 is an automated high voltage enclosed insulated electric switch, and can be set to automatically reclose three times before permanently locking out. As known in the art, reclosers are substituted for high voltage line fuses in various points of the distribution system for improved continuity of service. Recloser 402 includes an input terminal 404 connected to the high voltage source conductor 336 (from the mainline feeder 202), and an output terminal or load bushing 405 connected to the high voltage tap conductor 346. In accordance with one embodiment, the recloser 402 is positioned proximate the isolator actuator 211, so that the spring arm 330 is able come in contact with and apply a sustained ground fault to the recloser load bushing 404 after the fuse element in the fused link 324 melts. This causes the recloser 402 to open an internal switch and electrically disconnect the high voltage source conductor 336 from the high voltage tap conductor 346. A recloser operating handle 406 indicates an open or closed status of the internal switch of recloser 402. The recloser switch container requires an insulated operating medium which may be oil, vacuum or SF6 Gas.

Figure 5A:
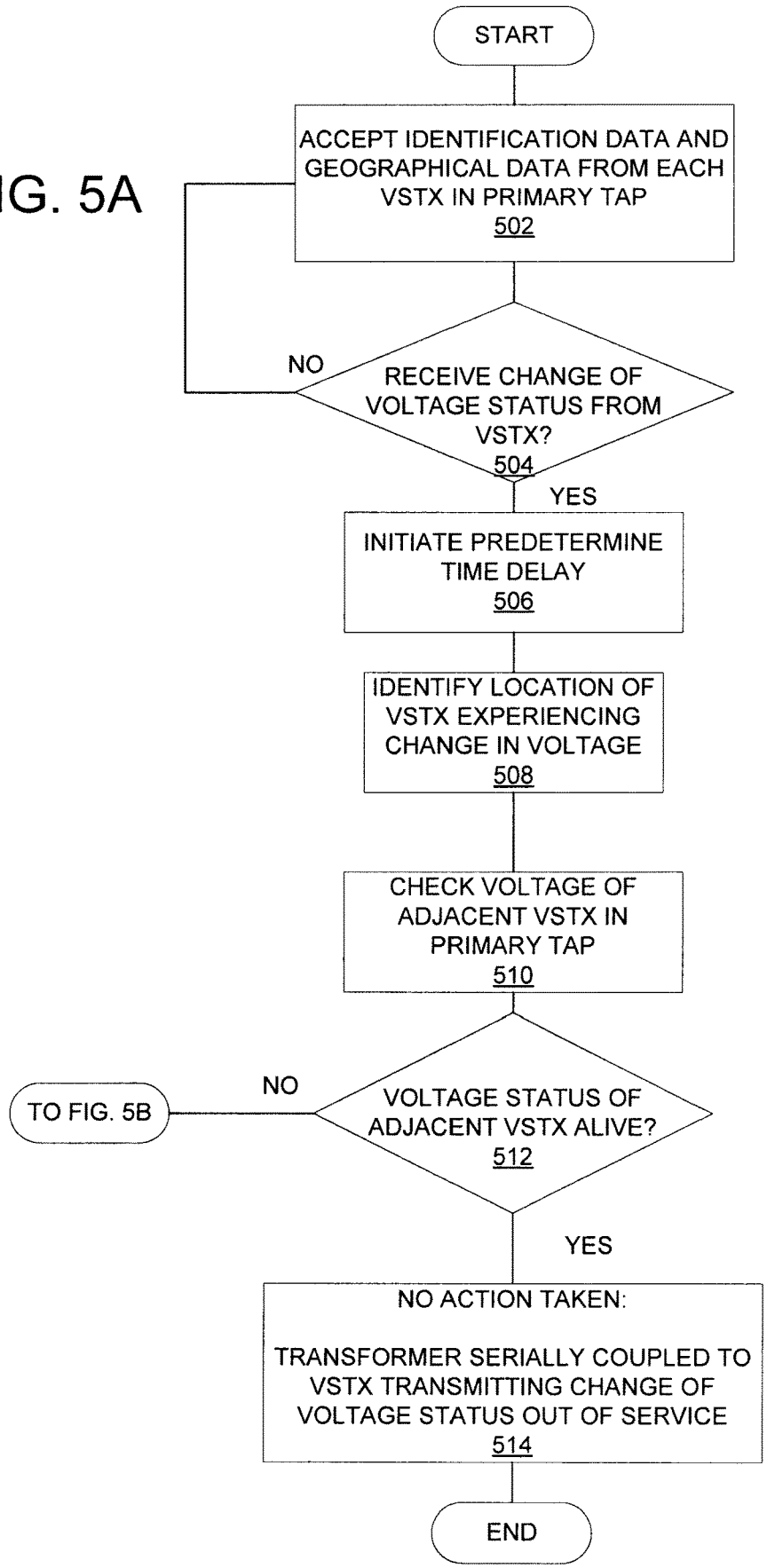

Referring now to FIGS. 5A and 5B, a process executed by the controller 308 for enabling the HIFIS 300 to electrically isolate the troubled primary tap 214 is described. At the beginning of the process, the controller 308, through the RF receiver 306, accepts entry of associated identification data and geographical location data transmitted from each VSTX 226, 234, 242 in the primary tap 212 (Block 502). The controller 308 then determines whether the voltage detected by each VSTX 226, 234, 242 in its respective serially coupled combination circuits 220, 228, 236 and transmitted to the controller 308, changes to a value less than a predetermined voltage, e.g., <85 VAC (Block 504). This voltage status check is performed every predetermined cycle, e.g., every 5 seconds.

Figure 1:
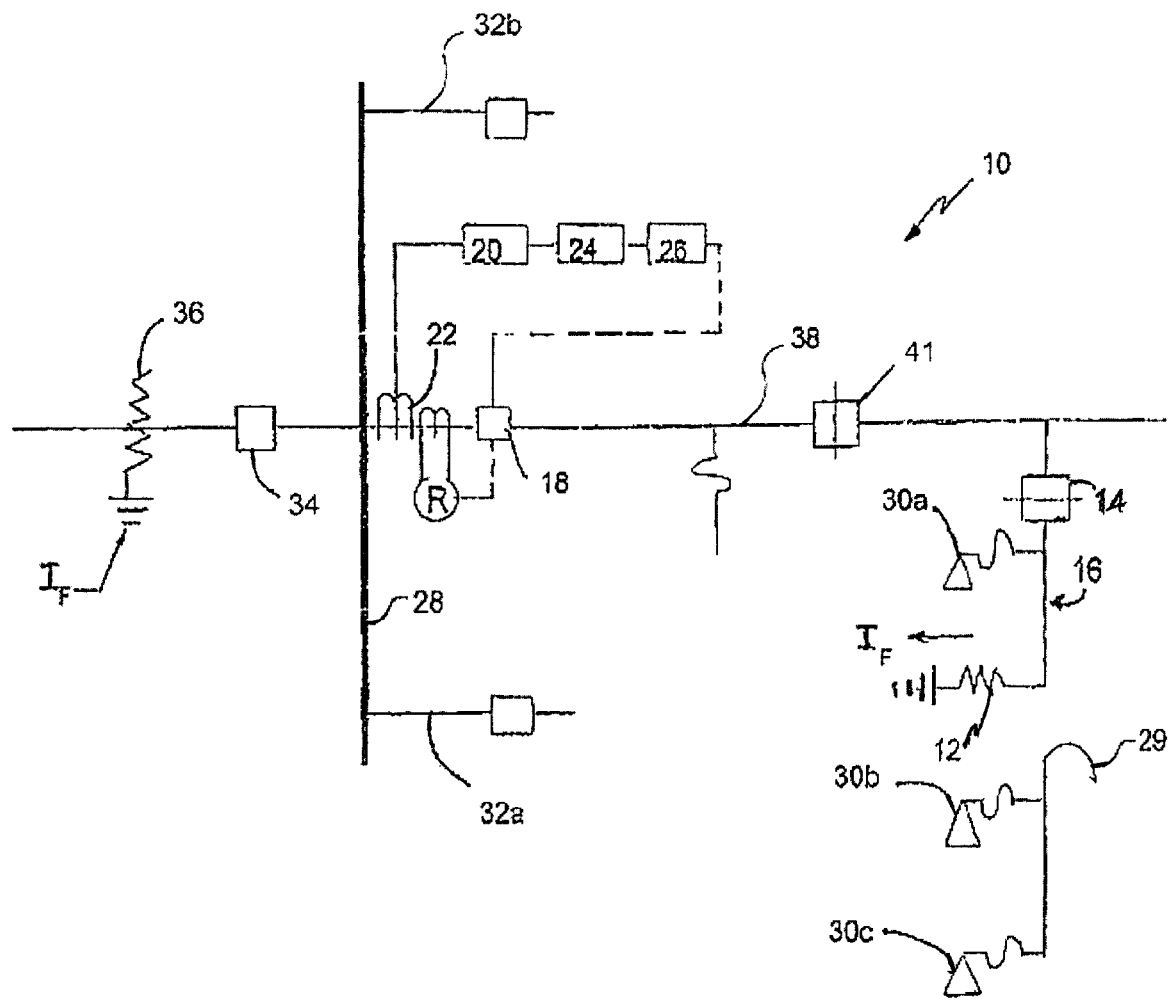
FIG. 1 is a simplified combined block and schematic diagram of a prior art high voltage fault sensing arrangement in an electric power distribution network.

When there is a change in the voltage to a value less than the predetermined amount, the controller 308 initiates a predetermined time delay, e.g., 45 sec. (Block 506). The time delay permits a substation breaker 18 or recloser 41 (See FIG. 1), if provided in the HIFIS system 300, to clear momentary faults in the primary tap 202. After the time delay, the controller 308 identifies the location of the target VSTX 226, 234 or 242 that has experienced the change in voltage to a value than the predetermined voltage (Block 508), and then checks the voltages of the VSTX's adjacent the target VSTX 226, 234 or 242 (Block 510). For example, if the target VSTX is VSTX 234, then the adjacent VSTX's would be VSTX 226 and VSTX 242. If the adjacent VSTX's are alive (i.e., the controller 308 receives from the adjacent VSTX 226 and VSTX 242, for example, the voltages detected in the corresponding serially coupled combination circuits 220 and 236) (Block 512), the controller 308 takes no action concerning the fuse isolator actuator 211 (Block 514). This is because the cause of the target VSTX experiencing the voltage change is limited to a single transformer 224, 232 or 242 in a corresponding serially coupled combination circuit (i.e., first, second or third serially coupled combination circuit 220, 228, 236), and not as a result of a high impedance fault from a downed line or break in the primary tap 212.

If the VSTX's adjacent to the target VSTX are not alive (i.e., the controller 308 does not receive any signal at all from the adjacent VSTX's or receives signals from the adjacent VSTX's indicating that no voltage is detected in the corresponding serially coupled combination circuits 220, 228 or 236) (Block 512), the controller 308 checks the mainline feeder 202 to determine whether voltage is being supplied to the primary tap 212 (Block 516) (FIG. 5B). This is accomplished by the controller 308 determining whether it is being supplied with the 120 AC voltage through the voltage source line 316 and checking the voltage status of every VSTX in the primary tap 212. If no voltage is supplied through the voltage source line 316 and no VSTX in the primary tap 212 senses a voltage, then the controller 308 determines that the mainline feeder 202 is down or out of service. In one embodiment, the controller 308 may be electrically connected to a short term energy storage source (not shown) provided within the control box 244, such as a battery or a capacitor, to enable the controller 308 to continue to operate when the primary tap 212 is out of service.

If the controller 308 determines that the mainline feeder 202 is down or out of service, i.e., no voltage on the mainline feeder (Block 518), no action is taken by the controller 308 (Block 520), and the process comes to an end. If, however, the mainline feeder 202 is alive, the controller 308 determines whether the primary tap fuse isolator 210 has been activated, i.e., whether the fused expulsion cutout 340 has been detached from the coupling bracket 342 to electrically disconnect the high voltage source conductor 336 from the high voltage tap conductor 346 (Block 522). The controller 308 determines that the primary tap fuse isolator 210 has been activated when the mainline feeder 202 is alive and all the VSTX's 226, 234, 242 in the primary tap 212 are out of service, i.e., no voltage is detected from any of the VSTX's in the primary tap 212. If the primary tap fuse isolator 210 has been activated, then the controller 308 takes no further action, since the fault in the primary tap 212 has already been isolated from the high voltage source conductor 336 (Block 524). In this situation, the primary tap fuse isolator 210 has been activated on its own due to the fault current in the primary tap 212 being of sufficient magnitude to melt the conductive fuse element 338 in the primary tap fuse isolator 210, without being activated by the isolator actuator 211.

If the controller 308 determines that the primary tap fuse isolator 210 has not been activated, i.e., the fused expulsion cutout 340 has not been detached from the coupling bracket 342 (Block 522), the controller 308 outputs a control signal to activate the primary tap fuse isolator 210 (Block 526). At this point, the fact that the primary tap fuse isolator 210 has not been activated, indicates a high impedance low current fault condition exists in the primary tap 212. Outputting of the control signal from the controller 308 causes the relay 309 to output the 120 AC voltage to the fuse isolator actuator 211 via the control power line 318, as described above. The voltage from the control power line 318 melts the grounded fuse element inside the fused link 324, thereby releasing the spring arm 330 from the loaded position to the activated position. In the activated state, the grounded spring 332 electrically connects the high voltage conductive fuse element 338 with the grounding line 333, which overloads and melts the conductive fuse element 338 within the fused expulsion cutout 340. This releases the fused expulsion cutout 340 from the coupling bracket 342 and allows it to pivot about the hinge 344 and fall under the influence of gravity in the direction of arrow shown by the dotted arrow 348. In this manner, the electrical connection between the high voltage source conductor 336 and the high voltage tap conductor 346, which is connected to the primary tap 212, is completely broken, thereby de-energizing the troubled primary tap 214.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matters set forth in the foregoing description and accompanying drawings are offered by way of illustration only and not as a limitation. The actual scope of the invention is intended to be defined in the following claims when viewed in their proper perspective based on the prior art.

What is claimed is:

1. An apparatus for detecting an electrical fault in a primary tap on a power distribution system, the primary tap having a plurality of distribution transformers each provided in a corresponding plurality of distribution circuits along a length of the primary tap, said apparatus comprising:
- a voltage monitor provided at each of the distribution circuits for monitoring a voltage status in a corresponding distribution circuit;
- a controller in communication with each of the voltage monitors for receiving the voltage status monitored and transmitted by the voltage monitors, wherein the controller determines that the electrical fault exists in the primary tap based on the voltage statuses monitored and transmitted by the plurality of voltage monitors and in response to the determination outputs a control signal;
- a fuse isolator configured to electrically connect the primary tap to a high voltage on the power distribution system and electrically disconnect the primary tap from the high voltage on the power distribution system when activated;
- a fuse isolator actuator for activating the fuse isolator responsive to a determination of a fault in the primary tap by the controller, the fuse isolator actuator comprising (1) a grounding spring having a spring arm and configured to have the spring arm in a first position away from the fuse isolator or a second position in electrical contact with the fuse isolator; and (2) a fuse link configured to maintain the spring arm in the first position in an absence of the control signal from the controller, and to release the spring arm from the first position and allow the spring arm to be placed in the second position in contact with the fuse isolator responsive to the determination; and
- a relay in communication with the controller, wherein the relay responsive to the control signal closes a circuit including the fuse link responsive to the control signal from the controller, the circuit having sufficient voltage to melt a fuse element of the fuse link.

2. The apparatus as defined in claim 1, wherein each of the distribution transformers comprises a step down transformer for reducing a voltage on the primary tap to a predetermined lower voltage in the corresponding distribution circuit;
- each of the voltage monitors comprises a voltage sensor for detecting a voltage in corresponding distribution circuits, and an RF transmitter for transmitting the voltage status to the controller; and
- an RF receiver for receiving the voltage statuses transmitted by the voltage monitors, the controller in communication with the voltage monitors via the RF receiver.

3. The apparatus as defined in claim 1, wherein the fuse isolator is configured to ground the high voltage on the power distribution system and subsequently electrically disconnect the primary tap from the high voltage on the power distribution system when activated by the fuse isolator actuator.

4. The apparatus as defined in claim 1, wherein the fuse link has a stationary portion and a free end portion which is configured to break away from the stationary portion to release the spring arm from the first position and placed in the second position when the circuit is closed by the relay.

5. The apparatus as defined in claim 1, further comprising a wire attached between the fuse link and the spring arm for holding the spring arm in the first position.

6. The apparatus as defined in claim 1 wherein the fuse isolator comprises an automatic recloser having an input terminal electrically connected to the high voltage on the power distribution system, an output terminal electrically connected to the primary tap, and an internal switch for electrically connecting and disconnecting the input terminal and the output terminal.

7. The apparatus as defined in claim 1 wherein the controller determines the fault exists when it receives from a first voltage monitor a voltage status of not alive,
- it receives from a second voltage monitor adjacent and downstream of the first voltage monitor along the primary tap an indication of a voltage status of not alive or determines that the second voltage monitor is out of service,
- it determines the high voltage on the power distribution system is being supplied to the primary tap and
- it determines the fuse isolator has not been activated.

8. The apparatus of claim 1 wherein the primary tap has a voltage from 4000 to 25000 VAC.

9. A method for detecting an electrical fault in a primary tap on a power distribution system, the primary tap having a plurality of serially coupled combination circuits provided along a length of the primary tap, and a fuse isolator configured to electrically connect the primary tap to a high voltage on the power distribution system and electrically disconnect the primary tap from the high voltage on the power distribution system when activated, said method comprising:
- monitoring, by a voltage monitor in each of the plurality of serially coupled combination circuits, a voltage status in a corresponding serially coupled combination circuit;
- transmitting the voltage status by each voltage monitor;
- receiving, by a processor, the voltage statuses monitored and transmitted by the voltage monitors;
- determining, by the processor, that a fault exists in the primary tap based on the voltage statuses monitored by the plurality of voltage monitors;
- responsive to the determination, melting a fuse element of a fuse link of a fuse isolator actuator thereby releasing a spring arm to electrically contact and activate the fuse isolator; and
- electrically disconnecting by the fuse isolator the primary tap from the high voltage on the power distribution system.

10. The method as defined in claim 9 wherein the determining of the existence of the fault comprises
- receiving a voltage status of not alive from a first voltage monitor,
- receiving from a second voltage monitor adjacent and downstream of the first voltage monitor along the primary tap a voltage status of not alive or determining that the second voltage monitor is out of service,
- determining that the high voltage on the power distribution system is being supplied to the primary tap, and
- determining that the fuse isolator has not been activated.

11. The method as defined in claim 10 wherein the determining of whether the high voltage on the power distribution system is being supplied to the primary tap comprises checking, by the processor, an output of a transformer operatively connected to the power distribution system, and
- wherein the determination that the fuse isolator has not been activated comprises receiving at least one voltage status of alive from one of the voltage monitors.

* * * * *